United States Patent [19]

Otsubo et al.

[11] Patent Number: 5,404,370
[45] Date of Patent: Apr. 4, 1995

[54] PLANAR LIGHT EMITTING DEVICE HAVING A REDUCED OPTICAL LOSS

[75] Inventors: Koji Otsubo; Hajime Shoji, both of Kawasaki, Japan

[73] Assignee: Fujitsu Limited, Kanagawa, Japan

[21] Appl. No.: 235,792

[22] Filed: Apr. 29, 1994

[30] Foreign Application Priority Data

Apr. 30, 1993 [JP] Japan .................. 5-103401

[51] Int. Cl.$^6$ ............................................. H01S 3/19
[52] U.S. Cl. ...................... 372/45; 372/46; 437/129
[58] Field of Search ............... 372/45, 46, 96, 43, 372/44; 437/129

[56] References Cited

U.S. PATENT DOCUMENTS

| | | | |
|---|---|---|---|
| 4,943,970 | 7/1990 | Bradley | 372/45 |
| 5,034,955 | 7/1991 | Kwon et al. | 372/45 |
| 5,086,430 | 2/1992 | Kapon et al. | 372/50 |
| 5,216,686 | 6/1993 | Holm et al. | 372/45 |
| 5,245,622 | 9/1993 | Jewell et al. | 372/45 |
| 5,258,990 | 11/1993 | Olbright et al. | 372/46 |
| 5,274,655 | 12/1993 | Shieh et al. | 372/45 |
| 5,295,147 | 3/1994 | Jewell et al. | 372/45 |
| 5,309,464 | 5/1994 | Ko | 372/43 |
| 5,317,587 | 5/1994 | Ackley et al. | 372/45 |
| 5,343,487 | 8/1994 | Scott et al. | 372/46 |

FOREIGN PATENT DOCUMENTS

WO91/16748 10/1991 WIPO.

OTHER PUBLICATIONS

Electronics Letters, Jan. 1992, Yang et al., 28:274–276, *Continuous Wave Single Transverse Mode Vertical-Cavity Surface-Emitting Lasers Fabricated by Helium Implantation and Zinc Diffusion.*
Journal of Applied Physics, 1991, Lei et al., 69:7430–7434, *ZnSe/CaF$_2$ quarter wave Bragg reflector for the vertical-cavity surface-emitting laser*, Jun. 1991.
IEEE Photonics Technology Letters, Apr. 1990, Geels et al., 2:234–236, *Planarized Vertical-Cavity Surface-Emitting Lasers.*

*Primary Examiner*—Georgia Y. Epps
*Attorney, Agent, or Firm*—Armstrong, Westerman, Hattori, McLeland & Naughton

[57] ABSTRACT

A planar laser diode includes a substrate, a first multilayer structure on the substrate and formed of an alternate stacking of a first epitaxial layer and a second epitaxial layer, a cavity structure provided on the first multilayer structure and including an undoped active layer for producing optical radiation as a result of stimulated emission, a second multilayer structure provided on the cavity structure and formed of an alternate stacking of a third epitaxial layer and a fourth epitaxial layer, a first electrode structure on a bottom surface of the substrate, a second electrode structure for injecting carriers to said active layer via said cavity structure, an optical passage provided in one of the first and second electrode structures for allowing an optical beam to pass therethrough; a a current path structure provided between the second electrode structure and the active layer for providing a passage of the carriers, a current confinement structure for confining the passage of the carriers such that said carriers flow along a path generally coincident to an optical path of the optical beam, and a conductive region provided in contact with said the electrode structure for causing the carriers to flow therethrough, wherein the conductive region is provided so as to avoid the optical path.

14 Claims, 6 Drawing Sheets

PLANAR LIGHT EMITTING DEVICE HAVING A REDUCED OPTICAL LOSS

BACKGROUND OF THE INVENTION

The present invention generally relates to semiconductor devices and more particularly to a a planar laser diode having a reduced optical loss.

Planar laser diode is an essential device in the field of optical parallel processing including optical computing and optical interconnection. In the planar laser diodes, an optical beam is emitted in the direction perpendicular to the plane of the substrate. Thus, the planar laser diode has an optical cavity that causes a resonance in the vertical direction to the plane of the substrate. Such a planar laser diode is particularly advantageous with regard to the design of optical computing system as well as with regard to the possibility of expansion of the system. Further, the planar laser diode has various advantageous features such as low threshold current of oscillation associated with the small volume of optical cavity, single mode operation caused by the small optical cavity length, easy coupling to an optical fiber due to the small beam divergence, high yield of production associated with the elimination of cleavage process in the fabrication process, and easy test of the device in the state that the laser diodes are formed on the wafer.

FIG. 1 shows the construction of a conventional planar laser diode.

Referring to FIG. 1, the laser diode is constructed on a semiconductor substrate 21 of a first conductivity type, and a first reflecting structure 22 is provided on the substrate 21, wherein the reflecting structure 22 is formed of a number of semiconductor layers stacked with each other. More particularly, the first reflecting structure 22 is formed of an alternate stacking of a first semiconductor layer having a first refractive index and a second semiconductor layer having a second, different refractive index, wherein the first and second semiconductor layers forming the first reflecting structure 22 are doped to the first conductivity type. Further, a cavity structure 23 is provided on the first reflecting structure 22 with a thickness set equal to an integer multiple of one-half the wavelength of the optical beam to be produced by the laser diode. The cavity structure includes an active layer 23a sandwiched from above and below with a pair of cladding layers 23b, and produces an optical beam by stimulated emission. Further, a second reflecting structure 24, which has a similar construction as the first reflecting structure 22 except that the semiconductor layers forming the reflecting structure 24 are doped to a second, opposite conductivity type, is provided on the cavity structure 23. Further, a transparent electrode 25 is provided on the lower major surface of the substrate 21, and an electrode 26 is provided on the upper major surface of the second reflecting structure 24. In the structure of FIG. 1, the first and second reflecting structures 22 and 24 are formed such that the reflectivity exceeding 99% is obtained.

In the structure of FIG. 1, it should be noted that the injection of the current into the active layer 23a in the cavity structure 23 is achieved via the first and second reflecting structures 22 and 24. Thus, in order to achieve an efficient injection of the current, it is necessary to set the resistivity of the reflecting structures 22 and 24 and hence the resistivity of the semiconductor layers forming the reflecting structures 22 and 23 as small as possible. In order to reduce the resistivity of a semiconductor layer, it is necessary to increase the carrier density by increasing the impurity concentration level in the reflecting structures 22 and 23. On the other hand, such an increased carrier density in turn invites an increased absorption of the optical beam by the free carrier absorption in which carriers are excited upon absorption of optical radiation. It should be noted that such an absorption caused by the free carrier absorption appears conspicuously with increasing number of the semiconductor layers forming the reflecting structures 22 and 24.

FIG. 2 shows the relationship between the number of stacks of a GaAs layer and an AlAs layer that form together the reflecting structure 22 or 24 and the reflectivity, wherein the vertical axis represents the reflectivity and the horizontal axis represents the number of the stacks in a logarithmic scale. In view of the fact that the absorption of a semiconductor layer increases with increasing level of doping, it is expected that the tendency of saturation of reflectivity in FIG. 2 is even more enhanced when the impurity concentration level is increased in the reflecting structures 22 and 24. Further, it should be noted that resistivity of the reflecting structures 22 and 24 would increase with increasing number of the stacks, as each stack of the GaAs layer and the AlAs layer includes a heterojunction interface and associated potential barrier of carriers. Obviously, such potential barriers act to prevent the passage of carriers therethrough. As a result, the laser diode of FIG. 1 suffers from the problem of high resistance.

In order to eliminate the foregoing shortcomings of the conventional planar laser diode of FIG. 1, an inventor of the present invention has previously proposed a planar laser diode shown in FIG. 3, wherein the laser diode is constructed on a semiconductor substrate 31 of the first conductivity type. On the upper major surface of the substrate 31, there are provided a first reflecting structure 32 formed of an alternate stacking of a semiconductor layer $32_1$ and a semiconductor layer $32_2$ both doped to the first conductivity type, and a first cladding layer $33_1$ of the first conductivity type is provided on the first reflecting structure 32. On the first cladding layer $33_1$, an undoped first barrier layer $33_2$ is provided and an undoped active layer $33_3$ is provided on the first barrier layer $33_2$, wherein the active layer $33_3$ is sandwiched by the foregoing barrier layer $22_2$ from below and by an undoped second barrier layer $33_4$ from above to form a quantum well layer characterized by a quantum level of carriers. On the second barrier layer $33_4$, there is provided a second cladding layer $33_5$ of the second conductivity type, wherein the layers $33_1$–$33_5$ form an optical cavity 33. Further, a current confinement structure 34 of the first conductivity type is provided on the optical cavity 33 except for the part of the optical cavity 33 wherein the laser oscillation takes place, and a contact layer 35 of the second conductivity type is provided on the current confinement structure 34 such that the contact layer 35 establishes an intimate contact with the exposed surface of the second cladding layer $33_5$. Thus, a p-n junction is formed at the interface between the current confinement structure 34 and the contact layer 35, wherein the depletion region associated with the p-n junction pinches the path of the injection current such that the current flows selectively where the contact layer 35 establishes an intimate contact with the cladding layer $33_5$.

On the upper major surface of the contact layer 35, there is provided a second reflecting structure 36 formed of an alternate stacking of undoped semiconductor layers, wherein the second reflecting structure 36 is provided selectively in correspondence to the path of the optical beam in the laser diode, and an upper electrode 37 is provided on the upper major surface of the contact layer so as to surround the second reflecting structure 36. Further, the laser diode of FIG. 3 includes an anti-reflecting coating 38 provided on the lower major surface of the substrate 31 in correspondence to the part where the optical beam passes through, and an electrode 39 is provided on the lower major surface of the substrate 31 so as to surround the anti-reflecting coating 38. Thus, the optical beam produced by the laser oscillation in the laser diode of FIG. 3 is emitted through the anti-reflecting coating 38 in the downward direction from the substrate 31.

In the planar laser diode of FIG. 3, it should be noted that the reflecting structure 36 at the upper major surface of the contact layer 35 does not form a part of the current path. Thus, there is no need for doping the semiconductor layers that form the reflecting structure 36, and the optical absorption caused by the reflecting structure 36 is substantially reduced. As the injection current does not flow through the reflecting structure 36, the problem of the potential barrier associated with heterojunction interface in the reflecting structure 36 preventing the flow of carriers is successfully eliminated.

In the structure of FIG. 3, however, there remains the problem of optical absorption that is caused by the contact layer 35. It should be noted that the contact layer 35 is doped to a high impurity concentration level in order to provide a current path for the injection current, such that the current injected from the electrode 37 reaches the active layer 33$_3$ through the contact layer 35 with a minimum resistance. As the optical beam is reflected back and forth between the reflecting structures 32 and 36 in the structure of FIG. 3, there inevitably occurs a substantial absorption of the optical beam in the contact layer 35.

SUMMARY OF THE INVENTION

Accordingly, it is a general object of the present invention to provide a novel and useful planar semiconductor light emitting device wherein the foregoing problems are eliminated.

Another and more specific object of the present invention is to provide a planar laser diode having a reduced resistivity.

Another object of the present invention is to provide a planar laser diode for emitting an optical beam in the direction substantially perpendicular to epitaxial layers, comprising:

a substrate having upper and lower major surfaces;

a first multilayer structure provided on said substrate, said first multilayer structure comprising an alternate stacking of a first epitaxial layer having a first refractive index and a second epitaxial layer having a second refractive index, said first multilayer structure having upper and lower major surfaces and acting as a reflector for reflecting an optical beam in the direction perpendicular to said upper and lower major surfaces of said first multilayer structure;

a cavity structure having upper and lower major surfaces and provided on said upper major surface of said first multilayer structure, said cavity structure including an active layer having upper and lower major surfaces for producing optical radiation as a result of stimulated emission therein, said cavity structure emitting said optical radiation along an optical path generally perpendicular to said upper and lower major surfaces of said cavity structure;

a second multilayer structure provided on said upper major surface of said cavity structure, said second multilayer structure comprising an alternate stacking of a third epitaxial layer having a third refractive index and a fourth epitaxial layer having a fourth refractive index, said second multilayer structure having upper and lower major surfaces and acting as a reflector for reflecting an optical beam in the direction perpendicular to said upper and lower major surfaces of said second multilayer structure;

first electrode means provided on the lower major surface of said substrate for injecting first type carriers to said active layer via said first multilayer structure;

second electrode means for injecting second type carriers to said active layer via said cavity structure;

optical passage means provided in one of said first and second electrode means for allowing said optical beam to pass therethrough;

a contact structure of a semiconductor material forming a part of said cavity structure and provided between said second electrode means and said active layer for providing a passage of said second type carriers from said second electrode means to said active layer;

current confinement means provided between said second electrode means and said active layer for confining said passage of said second type carriers flowing from said second electrode means to said active layer through said contact structure, such that said second type carriers flow along a path generally coincident to said optical path of said optical beam; and a conductive region of a semiconductor material doped to said second conductivity type and provided in contact with said second electrode means for causing said second type carriers to flow therethrough, said conductive region being provided so as to avoid said optical path.

According to the present invention, the resistance of the laser diode is decreased substantially due to the formation of the conductive region of low resistance. As the conductive region is formed so as to avoid the optical path, no substantial optical absorption occurs in the optical beam by the carriers in the diffusion region. Associated with the reduction of optical absorption in the second multilayer structure, the number of stacks of the semiconductor layers forming the second multilayer structure is substantially reduced and the fabrication process of the planar laser diode is simplified.

Other objects and further features of the present invention will become apparent from the following detailed description when read in conjunction with attached drawings.

DETAILED DESCRIPTION OF PREFERRED EMBODIMENTS

Figure 1:
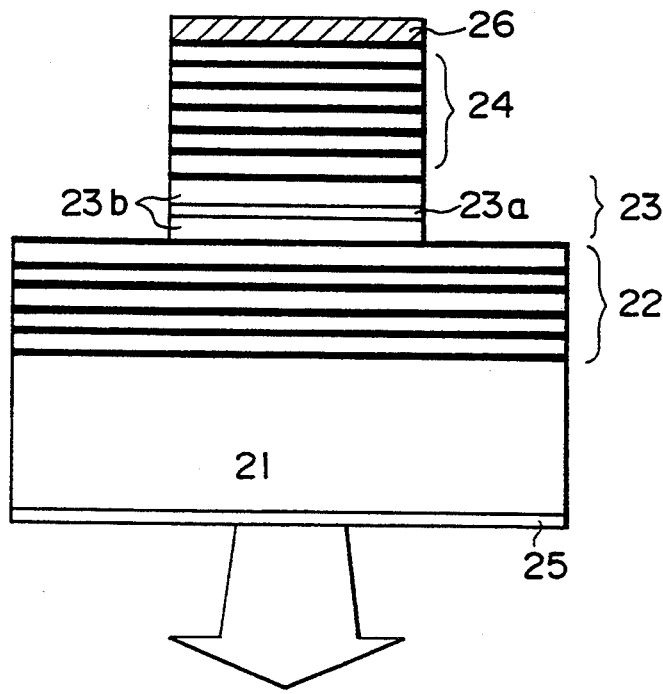
FIG. 1 is a diagram showing the construction of a conventional planar laser diode.
Figure 2:
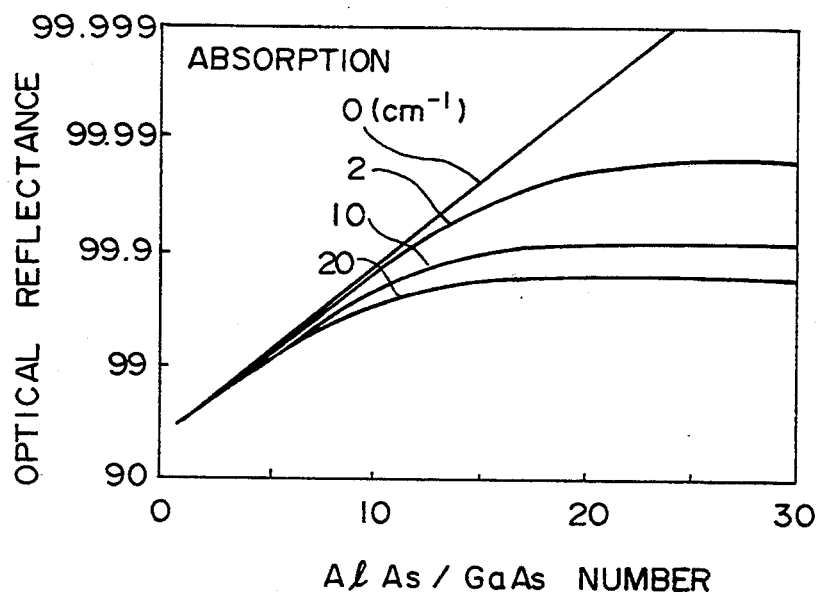
FIG. 2 is a diagram showing the relationship between the reflectivity and the number of stacks of the multilayer-film reflector used in the device of FIG. 1.
Figure 3:
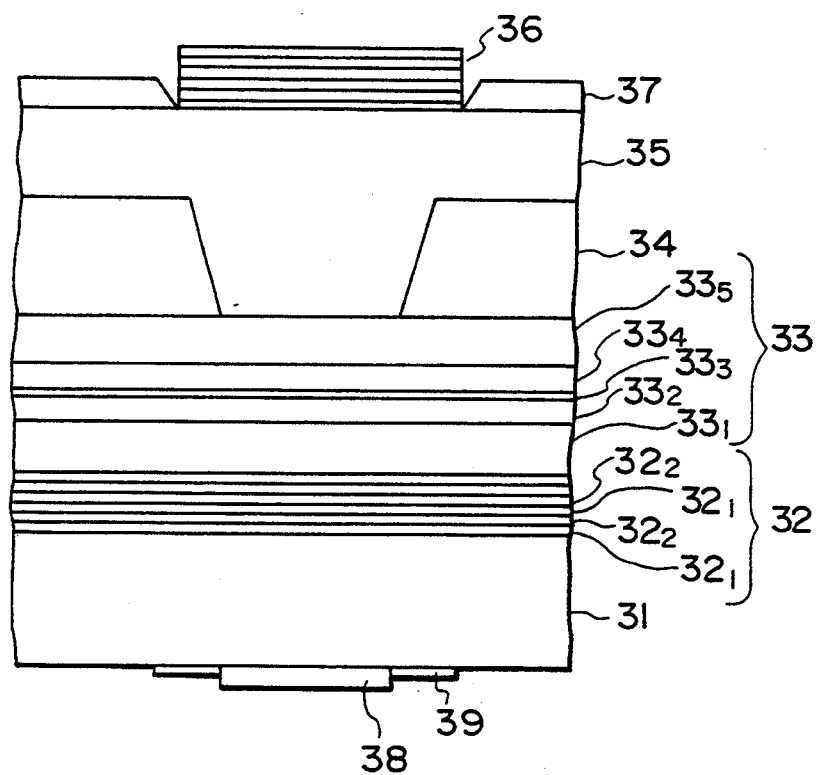
FIG. 3 is a diagram showing the construction of a conventional planar laser diode proposed by an inventor of the present invention.
Figure 4A:
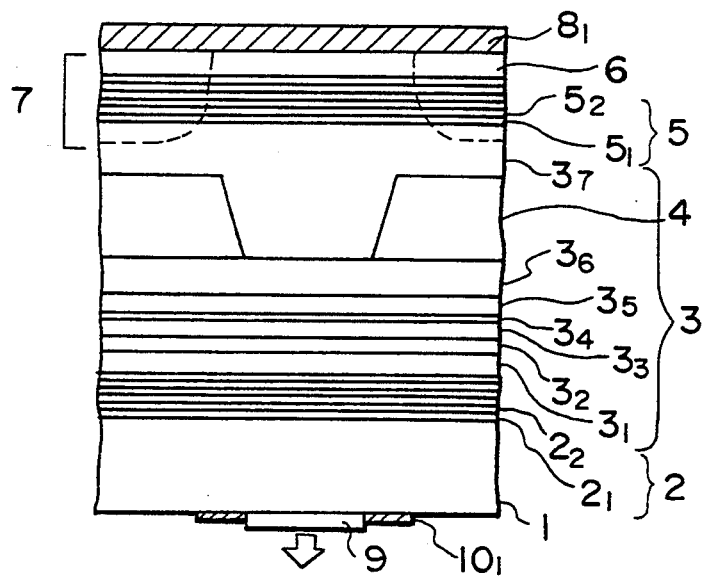
FIG. 4A is a diagram showing the construction of a planar laser diode according to a first embodiment of the present invention.
Figure 4B:
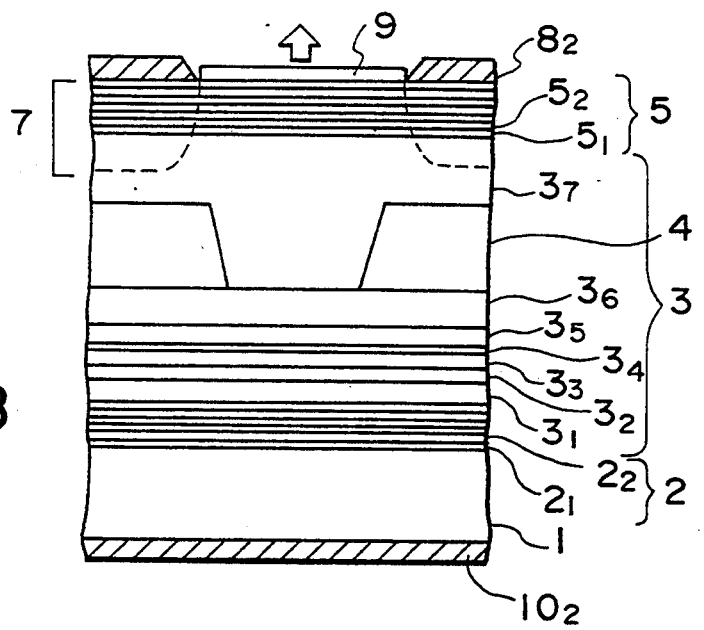
FIG. 4B is a diagram showing the construction of a modification of the planar laser diode of FIG. 4A.

FIGS. 4A and 4B show the construction of the planar laser diode according to a first embodiment of the present invention, wherein FIG. 4A shows the device that emits an optical beam in the downward direction while FIG. 4B shows the device that emits the optical beam in the upward direction.

Referring to FIG. 4A first, the planar laser diode is constructed upon an n-type GaAs substrate 1 doped to the concentration level of $2 \times 10^{18} cm^{-3}$, wherein an n-type multilayer-film structure 2 is provided on the upper major surface of the substrate 1. The multilayer-film structure 2 is formed of an alternate stacking of an AlAs layer $2_1$ and a GaAs layer $2_2$ both doped to the n-type with a concentration level of $3 \times 10^{18} cm^{-3}$. Each of the layers $2_1$ and $2_2$ has a thickness set equal to one-fourth the wavelength of the optical beam to be produced by the laser diode. The multilayer-film structure 2 thus formed has a periodically changing refractive index and acts as a reflector of a coherent optical beam, provided that the optical beam has a wavelength that matches the period of repetition of the layers $2_1$ and $2_2$. Further, a cavity structure 3 is provided on the multilayer-film structure 2 as the cavity of the planar laser diode. In the illustrated example, the laser diode produces an optical beam with an oscillation wavelength of about 0.98 μm.

More specifically, the cavity structure 3 includes a first cladding layer $3_1$ of AlGaAs having a thickness of 104.75 nm and doped to the n-type with an impurity concentration level of $3 \times 10^{18} cm^{-3}$ wherein a second cladding layer $3_2$ of undoped AlGaAs is provided on the first cladding layer $3_1$ with a thickness of 30 nm. Further, a barrier layer $3_3$ of undoped AlGaAs is provided on the second cladding layer $3_2$ with a thickness of 10 nm, while the barrier layer $3_3$ sandwiches, together with another barrier layer $3_5$ of undoped AlGaAs, a thin active layer $3_4$ of undoped InGaAs such that there is formed a quantum well in the active layer $3_4$. In the illustrated example, the active layer $3_4$ has a thickness of 8 nm. The barrier layer $3_5$, on the other hand, has a thickness of 10 nm. Further, a third cladding layer $3_6$ of undoped AlGaAs is provided on the barrier layer $3_5$ with a thickness of 134.75 nm, and a fourth cladding layer $3_7$ of undoped or lightly doped AlGaAs is provided on the third cladding layer $3_6$. It should be noted that the lower major surface of the cladding layer $3_1$ and the upper major surface of the cladding layer $3_7$ define together the foregoing cavity structure 3, and there occurs a back-and-forth reflection of optical radiation which is produced in the active layer $3_4$ as a result of recombination of electrons and holes. The thickness of the cladding layer $3_7$ is set such that the cavity structure 3 causes a desired resonance at the desired oscillation wavelength of the laser diode. The optical radiation thus produced is amplified as a result of stimulated emission taking place in the active layer $3_4$ while it is reflected back and forth between the lower major surface of the first cladding layer $3_1$ and the upper major surface of the fourth cladding layer $3_7$. As a result, a coherent optical beam is produced such that the optical beam propagates in the direction perpendicular to the upper and lower major surfaces of the cavity structure 3.

It should be noted that the third cladding layer $3_6$ carries thereon a current confinement structure 4 of n-type InGaP, wherein the current confinement structure 4 has a thickness of 150 nm and is patterned such that the upper major surface of the cladding layer $3_6$ is exposed in correspondence to the part where the optical beam passes through. Thus, the fourth cladding layer $3_7$ establishes a direct and intimate contact with the exposed upper major surface of the cladding layer $3_6$ only in correspondence to the path of the optical beam. Otherwise, the contact between the first cladding layer $3_6$ and the fourth cladding layer $3_7$ is prohibited by the current confinement structure 4.

The cladding layer $3_7$ has an upper major surface and has a thickness of 595.0 nm in the region that forms the path of the optical beam. The cavity structure 3 thereby has a cavity length set equal to an integer multiple of the half oscillation wavelength of the laser diode.

On the upper major surface of the cladding layer $3_7$, there is provided a second multilayer-film structure 5 acting as a second reflector, wherein the second multilayer-film structure 5 includes an alternate stacking of an undoped AlAs layer $5_1$ and an undoped GaAs layer $5_2$ similarly to the first multilayer-film structure 2 except for the conductivity type. Thus, the second multilayer-film structure 5 provides a periodically changing refractive index that causes a reflection of the optical beam at the upper major surface of the cladding layer $3_7$. Further, there is provided a phase matching layer 6 of undoped GaAs for adjusting the phase of the reflected optical beam.

In the structure of FIG. 4A, an upper electrode layer $8_1$ of Ti/Pt/Au is provided on the upper major surface of the layer 6, and a lower electrode layer $10_1$ of AuGe/Au having a central aperture is provided on the lower major surface of the substrate 1 such that the lower major surface of the substrate 1 is exposed in correspondence to the path of the optical beam. Thereby, the optical beam is radiated from the substrate 1 in the downward direction through the exposed part of the lower major surface of the substrate 1. In order to facilitate the emission of the optical beam, there is provided an anti-reflection coating 9 of SiN on the lower major surface of the substrate 1 in correspondence to the passage of the optical beam, wherein the anti-reflection coating 9 is provided with a thickness corresponding to one-quarter the wavelength of the optical beam produced by the laser diode.

In the structure of FIG. 4A, it should be noted that there is formed a diffusion region 7 of the $p^+$-type in the multilayer-film structure 5 including the layer 6 as well as a part of the clad layer $3_7$, such that the diffusion region 7 extends from the electrode $8_1$ to the cladding layer $3_7$ continuously and surrounds the path of the optical beam. Thereby, the injection of the carriers from the electrode $8_1$ to the active layer $3_1$ is substantially facilitated, without applying doping to the multilayer-film structure 5 or the clad layer $3_7$. As the diffusion region 7 avoids the path of the optical beam, the problem of unwanted optical absorption by the optical excitation of carriers in the semiconductor layers is successfully avoided. As a result, the absorption of the optical beam by the multilayer-film structure 5 including the cladding layer $3_7$, is effectively minimized. It should be noted that the cladding layer $3_7$ may be lightly doped typically in the order of $10^{16} cm^{-3} – 10^{17} cm^{-3}$ as long as the optical absorption therein does not cause a noticeable degradation of operation of the laser diode. In view point of increasing the efficiency of current injection, it is preferred to dope the cladding layer $3_7$ lightly as set forth above.

The diffusion region 7 is typically formed by conducting an ion implantation process of the p-type dopant such as Zn while protecting the region of the optical path by a mask, followed by a thermal annealing process. Alternatively, one may carry out a thermal diffusion of Zn to form the diffusion region 7. Further, one may form such a diffusion region 7 also in the first multilayer structure 2.

The device of FIG. 4B has an essentially identical structure as the device of FIG. 4A except that the optical beam is emitted in the upward direction through the second multilayer-film structure 5. Thus, there is provided an electrode $8_1$ of Ti/Pt/Au on the upper major surface of the multilayer-film structure 5 wherein the electrode $8_1$ is provided with a window for allowing the passage of the optical beam through the exposed part of the structure 5. Further, the anti-reflection coating 9 is provided on the exposed surface of the multilayer structure 2.

In any of the devices of FIGS. 4A and 4B, one can eliminate the doping of the multilayer structure 5 in correspondence to the path of the optical beam as already noted, in addition to the layer $3_7$. Thus, the optical absorption by the excitation of the carriers in the layers $5_1$ and $5_2$ forming the structure 5 or in the layer $3_7$ is substantially eliminated. As the optical absorption by the multilayer structure 5 is thus reduced, one can decrease the number of stacks of the layers $5_1$ and $5_2$ in the structure 5. Thereby, the fabrication process of the device is simplified and the throughput of production of the laser diode is improved.

Figure 5A:
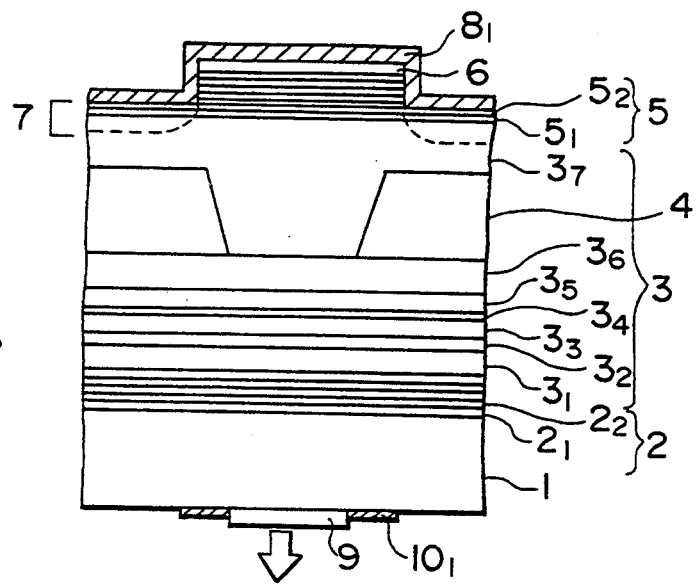
FIG. 5A is a diagram showing the construction of a planar laser diode according to a second embodiment of the present invention.
Figure 5B:
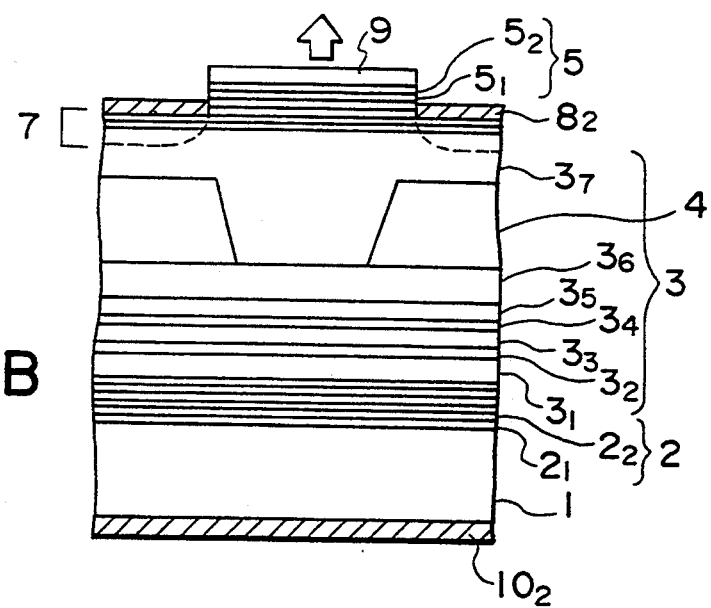
FIG. 5B is a diagram showing the construction of a modification of the planar laser diode of FIG. 5A.

Next, a second embodiment of the present invention will be described with reference to FIGS. 5A and 5B, wherein FIG. 5B shows a modification of the device of FIG. 5A.

Referring to FIG. 5A, the planar laser diode has a layered structure similar to the device of FIG. 4A except that the multilayer-film structure 5 is patterned to form a mesa in correspondence to the path of the optical beam. In the structure of FIG. 5A, the electrode $8_1$ covers the surface of the mesa structure thus formed continuously.

Such a structure is formed by providing a resist pattern on the multilayer-film structure 5 including the phase matching layer 6 in correspondence to the part forming the optical path of the beam, and applying a reactive etching process using a chlorine etching gas. Alternatively, one may employ a wet etching process. The etching may be carried out so as to eliminate the layers $5_1$ and $5_2$ completely except for the protected region or may be carried out such that several layers of the layers $5_1$ and $5_2$ are remained as indicated in FIG. 5A. Further, an ion implantation process of Zn is carried out while using the same resist pattern as a mask. Alternatively, one may remove the resist pattern and apply a SiN or $SiO_2$ mask such that the doping is carried out by a thermal diffusion process of Zn. In any of such a doping process, there is formed a diffusion region 7 in the cladding layer $3_7$ including a part of the multilayer-film structure 5. By providing the electrode $8_1$ uniformly over the entire surface of the structure 5, the diffusion region 7 extends from the electrode $8_1$ to the cladding layer $3_7$. As a result, the resistance of the laser diode is substantially reduced even when the cladding layer $3_7$ or the multilayer-film structure 7 is not provided with doping. Associated with this, the optical absorption by the layer $3_7$ is substantially eliminated.

FIG. 5B shows a modification of the structure of FIG. 5A wherein the optical beam is emitted in the upward direction from the multilayer-film structure 5. In this case, the lower major surface of the substrate 1 is entirely covered by the electrode $10_2$, while the upper major surface of the multilayer-film structure 5 is covered by the anti-reflection coating 9 in correspondence to the mesa structure. The rest of the structure 5 is covered by the electrode $8_2$.

Next, a third embodiment of the present invention will be described with reference to FIGS. 6A and 6B.

Figure 6A:
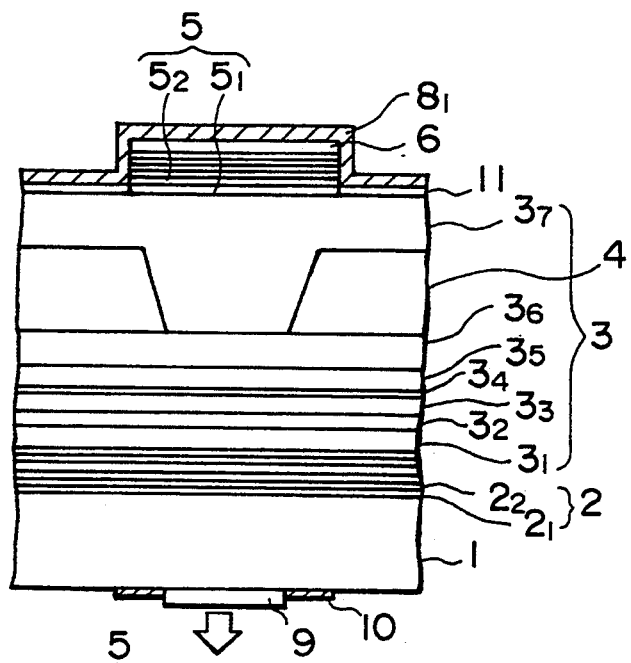
FIG. 6A is a diagram showing the construction of a planar laser diode according to a third embodiment of the present invention.

Referring to FIG. 6A showing the device that emits the optical beam in the downward direction from the substrate 1, there is provided a mesa structure in the multilayer-film structure 5 similarly to the device of FIG. 5A, wherein the multilayer-film structure 5 is entirely eliminated from the region other than the mesa structure. As a result, the upper major surface of the cladding layer 37 is exposed except for the region on which the mesa structure is formed, and a contact layer 11 of p+-type GaAs is provided on the exposed upper major surface of the cladding layer $3_7$. The contact layer 11 is doped typically to the impurity concentration level of $1 \times 10^{19} cm^{-3}$ or more. As a result, one can achieve a satisfactory injection of the current to the active layer from the electrode $8_1$.

When fabricating the structure of FIG. 6A, a p+-type GaAs layer is deposited on the entirely of the planar upper major surface of the cladding layer $3_7$, and an etching mask of a refractory material such as SiN or $SiO_2$ is provided further on the p+-type GaAs layer thus deposited such that the GaAs layer is exposed in correspondence to the part on which the mesa structure of the multilayer-film structure 5 is to be formed. Further, the exposed p+-type GaAs layer is removed by an etching process, leaving the protected GaAs layer as the contact layer 11. Next, while using the same etching mask as a mask, the undoped AlAs layer $5_1$ and the undoped GaAs layer $5_2$ are deposited alternately and repeatedly to form the mesa of the multilayer-film structure 5. Further, the phase matching layer 6 of GaAs is deposited on the upper major surface of the mesa structure thus formed, and the mask pattern is removed subsequently. After the mask pattern is thus removed, the electrode $8_2$ is deposited uniformly over the entire surface of the structure thus obtained.

Similarly to the device of the first and second embodiments described with reference to FIGS. 4A and 5A, the device of FIG. 6A minimizes the optical absorption by eliminating the doping to the multilayer-film structure 5 as well as to the cladding layer 37. Further, the cladding layer 3₇ may be doped to a lightly-doped level for reducing the resistance of the device further as noted already.

Figure 6B:
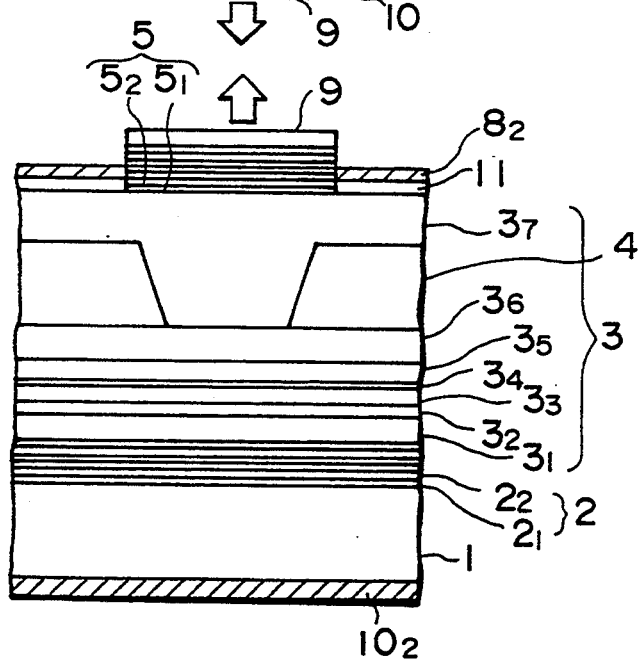
FIG. 6B is a diagram showing the construction of a modification of the planar laser diode of FIG. 6A.

FIG. 6B shows a modification of the device of FIG. 6A wherein the optical beam is emitted in the downward direction from the upper major surface of the multilayer-film structure 5, wherein the multilayer-film structure 5 forms a mesa having an upper major surface covered with the anti-reflection coating 9. Further, the lower major surface of the substrate 1 is covered with the electrode 10₂. As other aspects of the device of FIG. 6B are substantially identical with those of the device of FIG. 6A, further description thereof will be omitted.

Figure 7A:
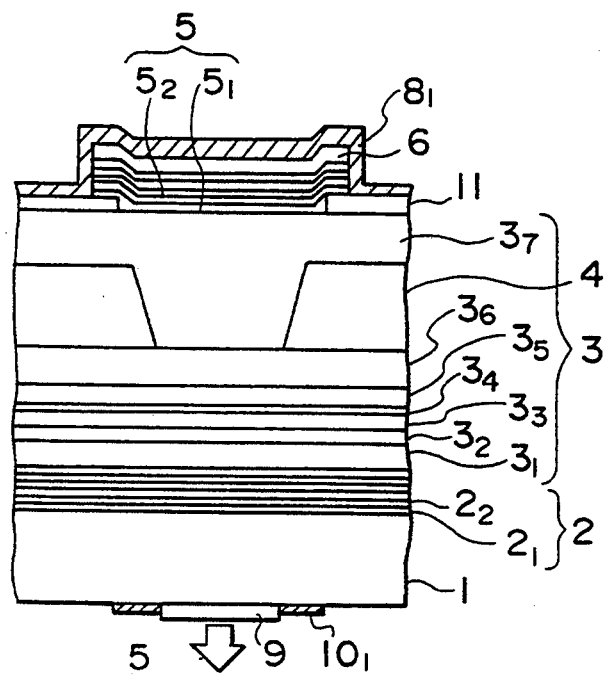
FIG. 7A is a diagram showing the construction of a planar laser diode according to a fourth embodiment of the present invention.
Figure 7B:
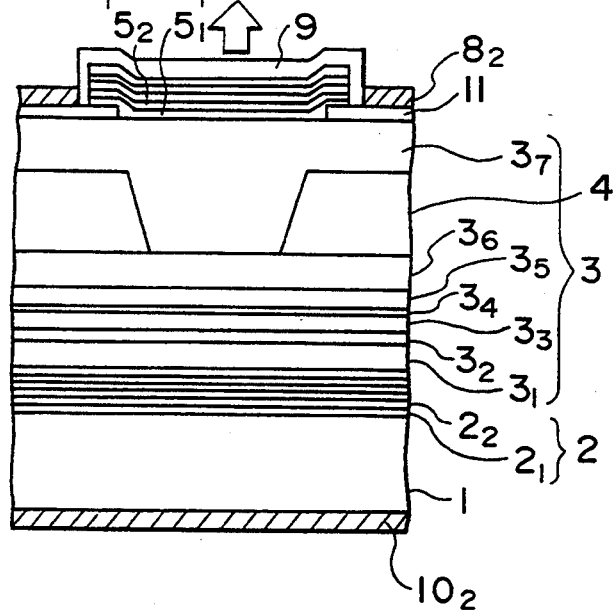
FIG. 7B is a diagram showing the construction of a modification of the planar laser diode of FIG. 7A.

Next, a fourth embodiment of the present invention will be described with reference to FIGS. 7A and 7B, wherein FIG. 7A shows a device that emits the optical beam in the downward direction while FIG. 7B shows the device that emits the optical beam in the upward direction.

Referring to FIG. 7A, the planar laser diode carries the contact layer 11 of p⁺-type GaAs on the upper major surface of the cladding layer 3₇ so as to expose the upper major surface of the layer 3₇ in correspondence to the part that forms the path of the optical beam. More specifically, a p⁺-type GaAs layer is deposited on the upper major surface of the cladding layer 3₇ and patterned subsequently to expose the part of the upper major surface of the layer 3₇ corresponding to the path of the optical beam. After the contact layer 11 is thus formed, the epitaxial layers 5₁ and 5₂ are stacked alternately on the entirely of the upper major surface of the layer 3₇ to form the multilayer-film structure 5 followed by a deposition of the phase matching layer 6 of GaAs. The multilayer structure 5 as well as the layer 6 thereon are patterned subsequently to form a mesa structure shown in FIG. 7A, and the electrode layer 8₁ is deposited on the mesa structure thus formed. Further, the electrode 10₁ and the anti-reflection coating 9 are provided on the lower major surface of the substrate 1. In this structure, too, the layers 5₁ and 5₂ forming the mesa structure 5 are undoped and the absorption of the optical beam does not occur in the mesa structure. Further, the cladding layer 3₇ is not doped at all or doped only to a lightly-doped level and the optical absorption in the cladding layer 3₇ is also minimized. Thereby, the device of the present invention shows various advantageous features similarly to the device described with reference to the previous embodiments. Further, the structure of the present embodiment eliminates the ion implantation process or thermal diffusion process of Zn conducted upon the multilayer-film structure 5 in the device of the first and second embodiments.

FIG. 7B shows a modification of the device of FIG. 7A, wherein the device emits the optical beam in the upward direction from the mesa structure of the multilayer-film 5. In the device of FIG. 7B, the mesa structure is covered with the anti-reflection coating 9 for facilitating the emission of the optical beam from the structure 5. As other aspects of the device of FIG. 7B are substantially identical with those of the device of FIG. 7A, further description thereof will be omitted.

Further, the present invention is not limited to the embodiments described heretofore, but various variations and modifications may be made without departing from the scope of the invention.

What is claimed is:

1. A planar laser diode for emitting an optical beam in the direction substantially perpendicular to epitaxial layers, comprising:

a substrate of a semiconductor material doped to a first conductivity type and having upper and lower major surfaces;

a first multilayer structure provided on said substrate, said first multilayer structure comprising an alternate stacking of a first epitaxial layer having a first refractive index and a second epitaxial layer having a second refractive index, each of said first and second epitaxial layers comprising a semiconductor material doped to said first conductivity type, said first multilayer structure having upper and lower major surfaces and acting as a reflector for reflecting an optical beam in the direction perpendicular to said upper and lower major surfaces of said first multilayer structure;

a cavity structure having upper and lower major surfaces and provided on said upper major surface of said first multilayer structure, said cavity structure including an undoped active layer having upper and lower major surfaces for producing optical radiation as a result of stimulated emission therein, said cavity structure emitting said optical radiation along an optical path generally perpendicularly to said upper and lower major surfaces of said cavity structure;

a second multilayer structure provided on said upper major surface of said cavity structure, said second multilayer structure comprising an alternate stacking of a third epitaxial layer having a third refractive index and a fourth epitaxial layer having a fourth refractive index, each of said third and fourth epitaxial layers comprising an undoped semiconductor material, said second multilayer structure having upper and lower major surfaces and acting as a reflector for reflecting an optical beam in the direction perpendicular to said upper and lower major surfaces of said second multilayer structure;

first electrode means provided on the lower major surface of said substrate for injecting first type carriers to said active layer via said first multilayer structure;

second electrode means for injecting second type carriers to said active layer via said cavity structure;

optical passage means provided in one of said first and second electrode means for allowing said optical beam to pass therethrough;

a current path structure of a semiconductor material forming a part of said cavity structure and provided between said second electrode means and said active layer for providing a passage of said second type carriers from said second electrode means to said active layer;

current confinement means provided between said second electrode means and said active layer for confining said passage of said second type carriers flowing from said second electrode means to said active layer through said contact structure, such that said second type carriers flow along a path generally coincident to said optical path of said optical beam; and a conductive region of a semiconductor material doped to a second conductivity type and provided in contact with said second electrode means for causing said second type carriers to flow therethrough, said conductive region being provided so as to avoid said optical path.

2. A planar laser diode as claimed in claim 1, wherein said current path structure comprises an undoped semiconductor material.

3. A planar laser diode as claimed in claim 1, wherein said current path structure comprises a doped semiconductor material doped with an impurity element with a concentration level of $1 \times 10^{16} - 10^{17} \text{cm}^{-3}$.

4. A planar laser diode as claimed in claim 1, wherein said conductive region comprises a diffusion region formed in said second multilayer structure so as to surround said optical path, said diffusion region penetrating from said multilayer structure to said current path structure.

5. A planar laser diode as claimed in claim 4, wherein said second multilayer structure forms a mesa structure in correspondence to said optical path, said diffusion region being formed to surround said mesa structure.

6. A planar laser diode as claimed in claim 1, wherein said conductive region comprises a diffusion region doped to said second conductivity type, said diffusion region being provided on said upper major surface of said second multilayer structure so as to surround said optical path.

7. A planar laser diode as claimed in claim 6, wherein said second multilayer structure forms a mesa structure in correspondence to said optical path, said diffusion region being provided on said upper major surface of said second multilayer structure so as to surround said mesa structure.

8. A planar laser diode as claimed in claim 1, wherein in that said conductive region comprises a semiconductor layer doped to said second conductivity type, said semiconductor layer being provided on said upper major surface of said current path structure so as to surround said optical path.

9. A planer laser diode as claimed in claim 8, wherein in that said second multilayer structure forms a mesa structure in correspondence to said optical path, said semiconductor layer being provided on said upper major surface of said current path structure so as to surround said mesa structure.

10. A method for fabricating a planar laser diode, comprising the steps of:
depositing first and second epitaxial layers having respective refractive indices alternately on a principal surface of a substrate to form a first reflection structure;
providing an optical cavity structure on a principal surface of said first reflection structure such that said optical cavity structure includes an active layer that produces an optical beam in a direction generally perpendicularly to a principal surface of said optical cavity by stimulated emission;
depositing third and fourth epitaxial layers having respective refractive indices alternately on said principal surface of said optical cavity to form a second reflection structure, said first and second reflection structures thereby reflecting back and forth said optical beam produced by said active layer in the direction substantially perpendicular to said principal surfaces of said first and second reflection structures; and
introducing an impurity element into said second reflection structure to form a diffusion region in said second reflection structure such that said diffusion region avoids the path of said optical beam.

11. A method for fabricating a planar laser diode, comprising the steps of:
depositing first and second epitaxial layers having respective refractive indices alternately on a principal surface of a substrate to form a first reflection structure;
providing an optical cavity structure on a principal surface of said first reflection structure such that said optical cavity structure includes an active layer that produces an optical beam in a direction generally perpendicularly to a principal surface of said optical cavity by stimulated emission;
depositing third and fourth epitaxial layers having respective refractive indices alternately on said principal surface of said optical cavity to form a second reflection structure, said first and second reflection structures thereby reflecting back and forth said optical beam produced by said active layer in the direction substantially perpendicular to said principal surfaces of said first and second reflection structures;
forming a mesa structure in said second reflection structure by etching away a part of said mesa structure that is offset from the path of said optical beam; and
introducing an impurity element to a region that surrounds said mesa structure to form a diffusion region such that said diffusion region penetrates into said optical cavity structure.

12. A method for fabricating a planar laser diode, comprising the steps of:
depositing first and second epitaxial layers having respective refractive indices alternately on a principal surface of a substrate to form a first reflection structure;
providing an optical cavity structure on a principal surface of said first reflection structure such that said optical cavity structure includes an active layer that produces an optical beam in a direction generally perpendicularly to a principal surface of said optical cavity by stimulated emission;
providing a conductive semiconductor layer on said principal surface of said optical cavity structure;
providing a mask pattern on a principal surface of said conductive semiconductor layer such that said mask pattern exposes said principal surface of said optical cavity structure in correspondence to a region that forms a passage of said optical beam; and
depositing third and fourth epitaxial layers having respective refractive indices alternately on said exposed principal surface of said optical cavity to form a second reflection structure, said first and second reflection structures thereby reflecting back and forth said optical beam produced by said active layer in the direction substantially perpendicular to said principal surfaces of said first and second reflection structures.

13. A method as claimed in claim 10, wherein said step of depositing third and fourth epitaxial layers is conducted while using said mask pattern on said principal surface of said optical cavity structure, such that said second reflection structure forms a mesa on said optical cavity structure upon deposition of said third and fourth epitaxial layers.

14. A method as claimed in claim 10, wherein said step of depositing third and fourth epitaxial layers is conducted after removing said mask pattern, wherein said method further comprises a step of patterning said second reflection structure to form a mesa structure such that the mesa structure covers said principal surface of said optical cavity structure in correspondence to the region that forms the passage of said optical beam.

* * * * *